(12) United States Patent
Lu

(10) Patent No.: US 6,891,326 B2
(45) Date of Patent: May 10, 2005

(54) STRUCTURE AND METHOD OF FABRICATING ORGANIC DEVICES

(75) Inventor: Min-Hao Michael Lu, Lawrenceville, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 10/295,322

(22) Filed: Nov. 15, 2002

(65) Prior Publication Data

US 2004/0095064 A1 May 20, 2004

(51) Int. Cl.[7] .................. H05B 33/00; H05B 33/10; H05B 33/14
(52) U.S. Cl. .................. 313/504; 313/503; 313/506; 313/509; 428/690; 428/917; 427/66; 445/24
(58) Field of Search .................. 313/503, 504, 313/506, 509; 428/690, 917; 427/66; 445/24

(56) References Cited

U.S. PATENT DOCUMENTS

| | | | |
|---|---|---|---|
| 4,769,292 A | | 9/1988 | Tang et al. |
| 5,247,190 A | | 9/1993 | Friend et al. |
| 5,681,756 A | * | 10/1997 | Norman et al. ............... 438/35 |
| 5,693,428 A | * | 12/1997 | Fujii et al. ................... 428/690 |
| 5,703,436 A | | 12/1997 | Forrest et al. |
| 5,707,745 A | | 1/1998 | Forrest et al. |
| 5,834,893 A | | 11/1998 | Bulovic et al. |
| 5,837,391 A | * | 11/1998 | Utsugi ........................ 313/504 |
| 5,844,363 A | | 12/1998 | Gu et al. |
| 6,013,982 A | | 1/2000 | Thompson et al. |
| 6,087,196 A | | 7/2000 | Sturm et al. |
| 6,091,195 A | | 7/2000 | Forrest et al. |
| 6,097,147 A | | 8/2000 | Baldo et al. |
| 6,294,398 B1 | | 9/2001 | Kim et al. |
| 6,303,238 B1 | | 10/2001 | Thompson et al. |
| 6,337,102 B1 | | 1/2002 | Forrest et al. |
| 6,447,934 B1 | * | 9/2002 | Suzuki et al. ............... 313/504 |
| 6,468,819 B1 | | 10/2002 | Kim et al. |
| 2001/0001050 A1 | | 5/2001 | Miyashita et al. |
| 2002/0041926 A1 | | 4/2002 | Miyashita et al. |
| 2002/0067123 A1 | | 6/2002 | Seki et al. |

FOREIGN PATENT DOCUMENTS

| | | |
|---|---|---|
| EP | 0 880 303 | 11/1998 |
| JP | 2000-36386 | 2/2000 |
| JP | 2000-208254 | 7/2000 |
| JP | 2002-175887 | 6/2002 |

OTHER PUBLICATIONS

M. A. Baldo, et al., "Highly efficient phosphorescent emission from organic electroluminescent devices," Nature, Sep. 1998, vol. 395, pp. 151–154.

M.A. Baldo, et al., "Very high–efficiency green organic light–emitting devices based on electrophosphorescence", Applied Physics Letters, vol. 75, No. 1, pp. 4–6, Jul. 5 1999.

C. Adachi, et al., "Nearly 100% internal phosphorescence efficiency in an organic light emitting device", J. Appl. Phys. 90, (2001).

U.S. Appl. No. 10/173,682.
U.S. Appl. No. 09/931,948.
U.S. Appl. No. 10/233,470.

Shih–Chun Lo, et al., "Green Phosphorescent Dendrimer for Light–Emitting Diodes", Adv. Mater. 2002, 14, No. 13–14, pp. 975–979, Jul. 4.

* cited by examiner

Primary Examiner—Nimeshkumar D. Patel
Assistant Examiner—Mariceli Santiago
(74) Attorney, Agent, or Firm—Kenyon & Kenyon

(57) ABSTRACT

An organic light emitting device that may have mixed organic layers is provided. A method of fabricating such an organic light emitting device is provided. A first organic material is solution deposited to form a patterned organic layer over a first electrode. A second organic material is deposited, by means other than solution processing, on and in physical contact with the first organic layer to form a second organic layer. The second organic layer forms a blanket layer over the first organic layer. A second electrode is then deposited over the second organic layer.

21 Claims, 3 Drawing Sheets

STRUCTURE AND METHOD OF FABRICATING ORGANIC DEVICES

RESEARCH AGREEMENTS

The claimed invention was made by, on behalf of, and/or in connection with one or more of the following parties to a joint university-corporation research agreement: Princeton University, The University of Southern California, and the Universal Display Corporation. The agreement was in effect on and before the date the claimed invention was made, and the claimed invention was made as a result of activities undertaken within the scope of the agreement.

This application is related to concurrently filed patent application Ser. No. 10/295,802, and patent application Ser. No. 10/295,808, each of which is incorporated by reference in its entirety.

FIELD OF THE INVENTION

The present invention relates to organic light emitting devices (OLEDs), and more specifically to organic devices having mixed organic layers, and methods of fabricating such devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be an fluorescent or phosphorescent small molecule emitter. A dendrimer may be a "small molecule," and it is believed that all dendrimers currently used in the field of OLEDs are small molecules.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic opto-electronic devices. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

One of the main goals of OLEDs is realization of patterned full color flat panel displays in which the red, green and blue pixels are patterned deposited. Due to the difficulty of using masks for large area substrates using vapor phase deposition systems, for example substrates larger than about 0.5 meters in diameter, it is believed that patterning of the displays using ink jet printing of solution-processible materials may offer significant advantages. Ink jet printing techniques are believed to be particularly suitable for patterning the solution-processible polymers that are used in OLEDS having a polymer-based emissive layer. However, the selection of materials that may be used in such polymer-based systems is typically limited by the fact that the solution that is used as the carrier medium has to be selected so as avoid dissolution of the underlying layer. A common choice is to use a PEDOT:PSS layer to provide hole injection and hole transport functions. PEDOT:PSS is soluble in water, but insoluble in certain organic solvents used to process polymer based emissive layers. As a result, solution processing may be used to deposit polymer based layers on PEDOT:PSS without dissolving the PEDOT:PSS.

High performance OLEDs, especially high performance electrophosphorescent OLEDs, typically require the presence of several layers that each perform separate functions. This means that it is highly desirable to be free to select from a wide variety of materials for each layer. For example, for high performance electrophosphorescent OLEDs, it is typically desirable to have two hole transport layers between the anode layer and the emissive layer. The first hole transport layer, which is in direct contact with the anode layer, is used primarily for its planarizing characteristics as well as for its more favorable hole injecting characteristics. This layer may be referred to as a hole injecting layer (HIL). The second hole transport layer (HTL), which may be in direct contact with the emissive layer is typically selected to have a high hole conductivity. This layer may also have the added function, at least in part, of blocking electrons and/or excitons.

It would be desirable to have a device wherein a patterned emissive layer deposited by patterning solution-processible materials is used in combination with an emissive layer deposited by other methods, so that the materials in the patterned emissive layer may be selected from a wide range of materials, independent of their solubility characteristics, while the emissive layer deposited by other methods may include materials not suitable for deposition via solution processing. Thus, a device capable of emitting a broad spectrum of light may be achieved.

SUMMARY OF THE INVENTION

An organic light emitting device that may have mixed organic layers is provided. A method of fabricating such an organic light emitting device is provided. A first organic material is solution deposited to form a patterned organic layer over a first electrode. A second organic material is deposited, by means other than solution processing, on and in physical contact with the first organic layer to form a second organic layer. The second organic layer forms a blanket layer over the first organic layer. A second electrode is then deposited over the second organic layer.

In particular, embodiments of the present invention are directed toward depositing a first organic layer comprising solution-processible emissive materials followed by depositing a second organic layer over the first organic layer by means other that solution processing in a full color organic light emitting display.

More specifically, embodiments of the present invention are directed toward using solution processing in conjunction with other deposition techniques in a full color organic light emitting display.

An objective of embodiments of the present invention is to provide a method for fabricating organic light emitting devices that have improved lifetimes. Such improved lifetimes may be uniquely achievable for electrophosphorescent devices, since the improved efficiencies of electrophosphorescent devices may permit a practically beneficial trade-off between efficiency and lifetime to be realized, a benefit that is uniquely attributable to the very high efficiencies of phosphorescent materials.

DETAILED DESCRIPTION

Figure 1:
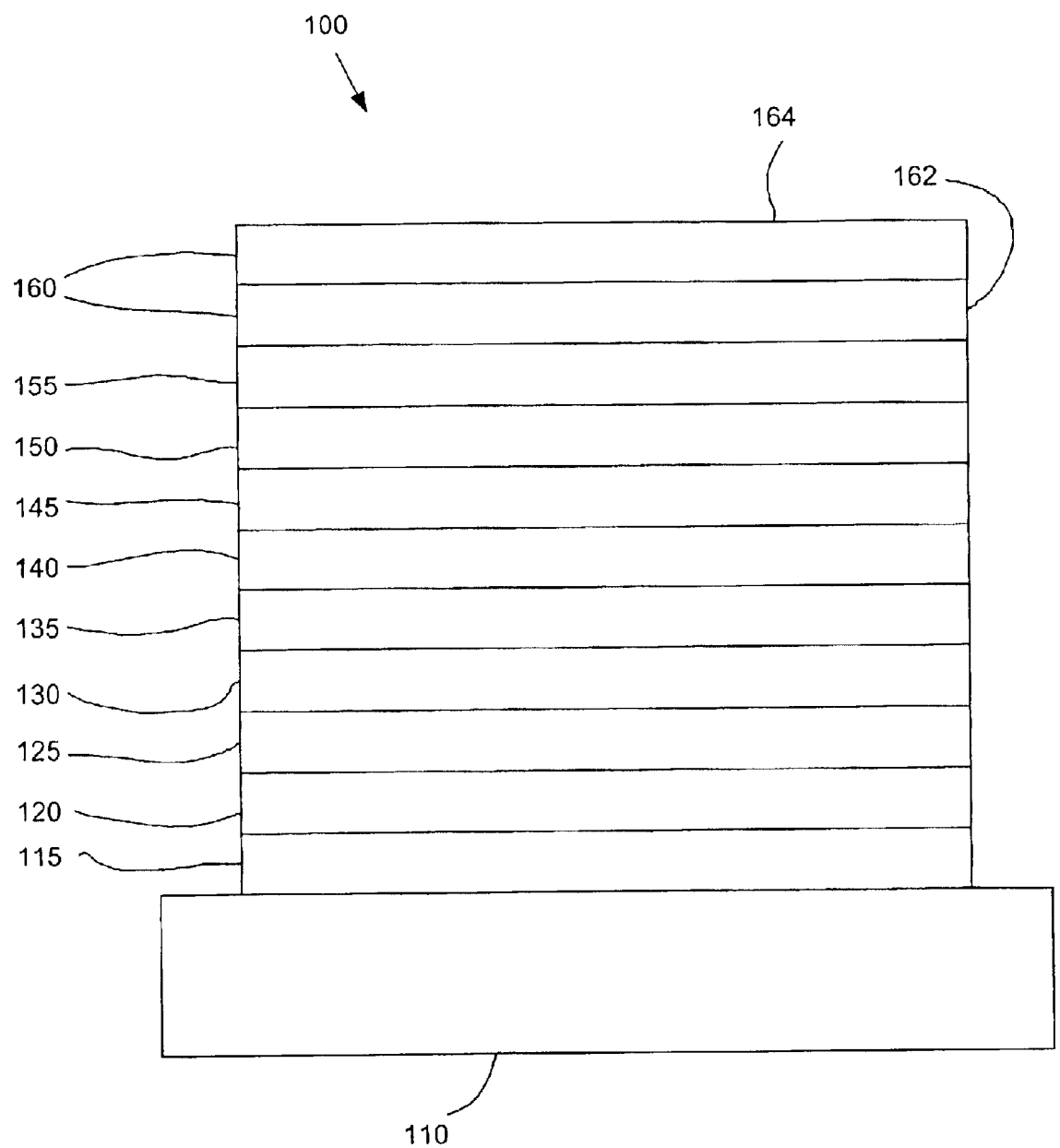
FIG. 1 shows an organic light emitting device having separate electron transport, hole transport, and emissive layers, as well as other layers.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151–154, 1998; ("Baldo-I") and Baldo et al., "Very high-efficiency green organic light-emitting devices based on electrophosphorescence," Appl. Phys. Lett., vol. 75, No. 3, 4–6 (1999) ("Baldo-II"), which are incorporated by reference in their entireties. Phosphorescence may be referred to as a "forbidden" transition because the transition requires a change in spin states, and quantum mechanics indicates that such a transition is not favored. As a result, phosphorescence generally occurs in a time frame exceeding at least 10 nanoseconds, and typically greater than 100 nanoseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-bipyridine is such a molecule. Non-radiative decay mechanisms are typically temperature dependent, such that a material that exhibits phosphorescence at liquid nitrogen temperatures may not exhibit phosphorescence at room temperature. But, as demonstrated by Baldo, this problem may be addressed by selecting phosphorescent compounds that do phosphoresce at room temperature.

Generally, the excitons in an OLED are believed to be created in a ratio of about 3:1, i.e., approximately 75% triplets and 25% singlets. See, Adachi et al., "Nearly 100% Internal Phosphorescent Efficiency In An Organic Light Emitting Device," J. Appl. Phys., 90, 5048 (2001), which is incorporated by reference in its entirety. In many cases, singlet excitons may readily transfer their energy to triplet excited states via "intersystem crossing," whereas triplet excitons may not readily transfer their energy to singlet excited states. As a result, 100% internal quantum efficiency is theoretically possible with phosphorescent OLEDs. In a fluorescent device, the energy of triplet excitons is generally lost to radiationless decay processes that heat-up the device, resulting in much lower internal quantum efficiencies. OLEDs utilizing phosphorescent materials that emit from triplet excited states are disclosed, for example, in U.S. Pat. No. 6,303,238, which is incorporated by reference in its entirety.

Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

Phosphorescence from triplets can be enhanced over fluorescence by confining, preferably through bonding, the organic molecule in close proximity to an atom of high atomic number. This phenomenon, called the heavy atom effect, is created by a mechanism known as spin-orbit coupling. Such a phosphorescent transition may be observed from an excited metal-to-ligand charge transfer (MLCT) state of an organometallic molecule such as tris(2-phenylpyridine)iridium(III).

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order.

Substrate 110 may be any suitable substrate that provides desired structural properties. Substrate 110 may be flexible or rigid. Substrate 110 may be transparent, translucent or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties.

Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. No. 5,844,363, which is incorporated by reference in its entirety. Anode 115 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material capable of transporting holes. Hole transport layer 130 may be intrinsic (undoped), or doped. Doping may be used to enhance conductivity. α-NPD and TPD are examples of intrinsic hole transport layers. An example of a p-doped hole transport layer is m-MTDATA doped with $F_4$-TCNQ at a molar ratio of 50:1, as disclosed in U.S. patent application Ser. No. 10/173,682 to Forrest et al., which is incorporated by reference in its entirety. Other hole transport layers may be used.

Emissive layer 135 may include an organic material capable of emitting light when a current is passed between anode 115 and cathode 160. Preferably, emissive layer 135 contains a phosphorescent emissive material, although fluorescent emissive materials may also be used. Phosphorescent materials are preferred because of the higher luminescent efficiencies associated with such materials. Emissive layer 135 may also comprise a host material capable of transporting electrons and/or holes, doped with an emissive material that may trap electrons, holes, and/or excitons, such that excitons relax from the emissive material via a photo-emissive mechanism. Emissive layer 135 may comprise a single material that combines transport and emissive properties. Whether the emissive material is a dopant or a major constituent, emissive layer 135 may comprise other materials, such as dopants that tune the emission of the emissive material. Emissive layer 135 may include a plurality of emissive materials capable of, in combination, emitting a desired spectrum of light. Examples of phosphorescent emissive materials include $Ir(ppy)_3$. Examples of fluorescent emissive materials include DCM and DMQA. Examples of host materials include $Alq_3$, CBP and mCP. Examples of emissive and host materials are disclosed in U.S. Pat. No. 6,303,238 to Thompson et al., which is incorporated by reference in its entirety. Emissive material may be included in emissive layer 135 in a number of ways. For example, an emissive small molecule may be incorporated into a polymer. Other emissive layer materials and structures may be used.

Electron transport layer 140 may include a material capable of transporting electrons. Electron transport layer 140 may be intrinsic (undoped), or doped. Doping may be used to enhance conductivity. $Alq_3$ is an example of an intrinsic electron transport layer. An example of an n-doped electron transport layer is BPhen doped with Li at a molar ratio of 1:1, as disclosed in U.S. patent application Ser. No. 10/173,682 to Forrest et al., which is incorporated by reference in its entirety. Other electron transport layers may be used.

The charge carrying component of the electron transport layer may be selected such that electrons can be efficiently injected from the cathode into the LUMO (Lowest Unoccupied Molecular Orbital) level of the electron transport layer. The "charge carrying component" is the material responsible for the LUMO that actually transports electrons. This component may be the base material, or it may be a dopant. The LUMO level of an organic material may be generally characterized by the electron affinity of that material and the relative electron injection efficiently of a cathode may be generally characterized in terms of the work function of the cathode material. This means that the preferred properties of an electron transport layer and the adjacent cathode may be specified in terms of the electron affinity of the charge carrying component of the ETL and the work function of the cathode material. In particular, so as to achieve high electron injection efficiency, the work function of the cathode material is preferably not greater than the electron affinity of the charge carrying component of the electron transport layer by more than about 0.75 eV, more preferably, by not more than about 0.5 eV. Most preferably, the electron affinity of the charge carrying component of the electron transport layer is greater than the work function of the cathode material. Similar considerations apply to any layer into which electrons are being injected.

Cathode 160 may be any suitable material or combination of materials known to the art, such that cathode 160 is capable of conducting electrons and injecting them into the organic layers of device 100. Cathode 160 may be transparent or opaque, and may be reflective. Metals and metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive layer. An electron blocking layer 130 may be disposed between emissive layer 135 and the hole transport layer 125, to block electrons from leaving emissive layer 135 in the direction of hole transport layer 125. Similarly, a hole blocking layer 140 may be disposed between emissive layer 135 and electron transport layer 145, to block holes from leaving emissive layer 135 in the direction of electron transport layer 140. Blocking layers may also be used to block excitons from diffusing out of the emissive layer. The theory and use of blocking layers is described in more detail in U.S. Pat. No. 6,097,147 and U.S. patent application Ser. No. 10/173,682 to Forrest et al., which are incorporated by reference in their entireties.

Generally, injection layers are comprised of a material that may improve the injection of charge carriers from one layer, such as an electrode or an organic layer, into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. patent application Ser. No. 09/931,948 to Lu et al., which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A hole injection layer (HIL) may planarize or wet the anode surface so as to provide efficient hole injection from the anode into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and the hole transporting layer on the opposite side of the HIL. The "charge carrying component" is the material responsible for the HOMO that actually transports holes. This component may be the base material of the HIL, or it may be a dopant. Using a doped HIL allows the dopant to be selected for its electrical properties, and the host to be selected for morpological properties such as wetting, flexibility, toughness, etc. Preferred properties for the HIL material are such that holes can be efficiently injected from the anode into the HIL material. In particular, the charge carrying component of the HIL preferably has an IP not more than about 0.7 eV greater that the EP of the anode material. More preferably, the charge carrying component has an IP not more than about 0.5 eV greater than the anode material. Similar considerations apply to any layer into which holes are being injected. HIL materials are further distinguished from conventional hole transporting materials that are typically used in the hole transporting layer of an OLED in that such HIL materials may have a hole conductivity that is substantially less than the hole conductivity of conventional hole transporting materials. The thickness of the HIL of the present invention may be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped with Li. A more detailed description of protective layers may be found in U.S. patent application Ser. No. 09/931,948 to Lu et al., which is incorporated by reference in its entirety.

Figure 2:
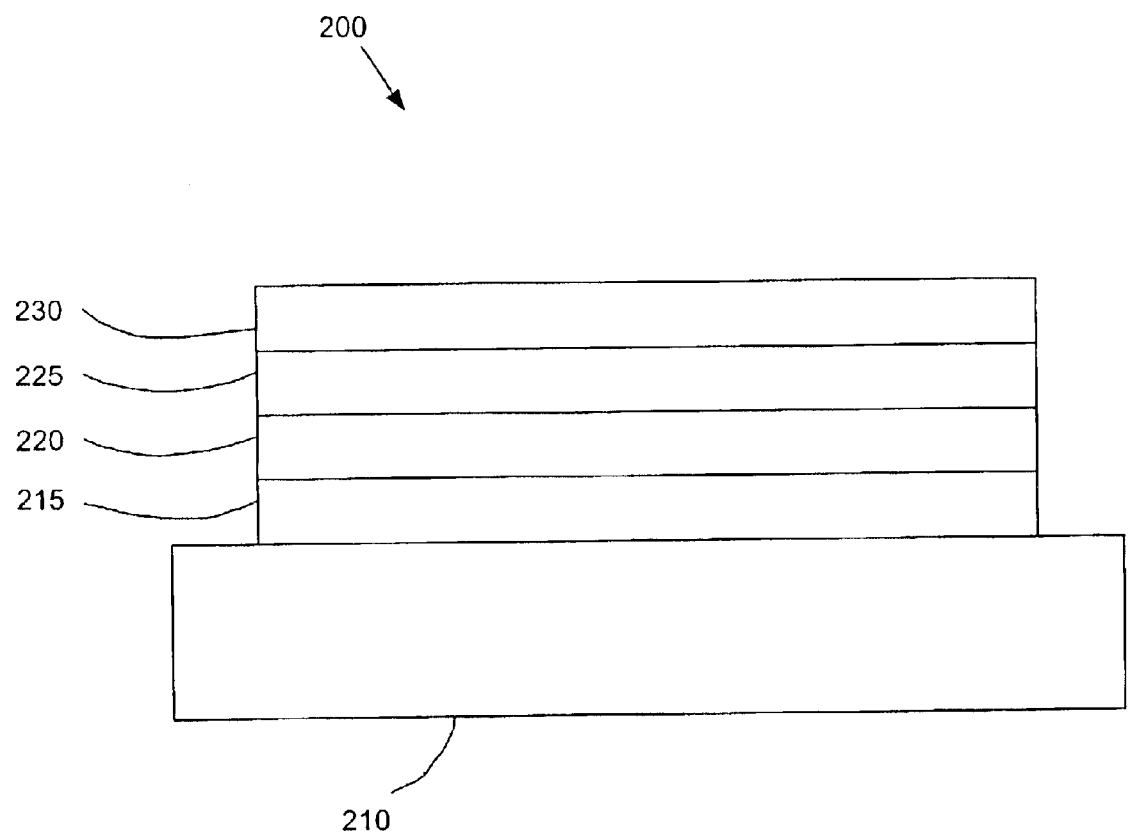
FIG. 2 shows an inverted organic light emitting device that does not have a separate electron transport layer.

FIG. 2 shows an inverted OLED 200. The device includes a substrate 210, an cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3–20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20–25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

Figure 3:
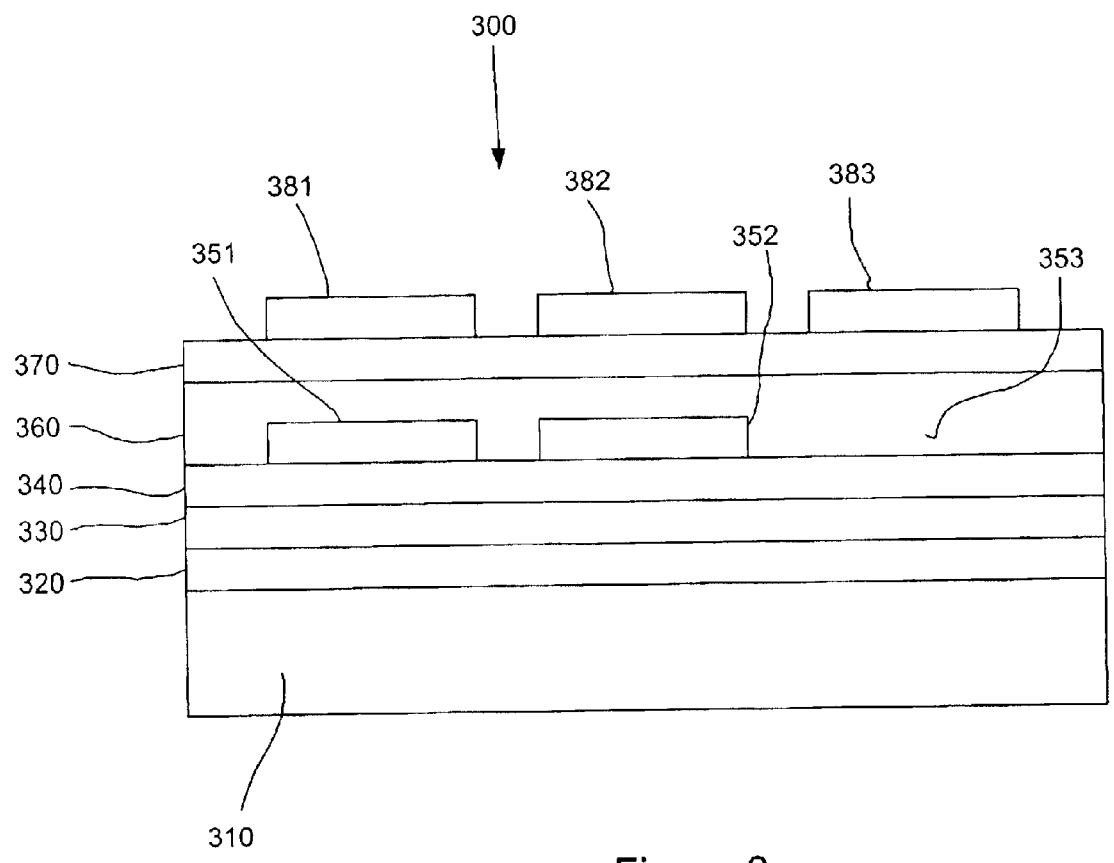
FIG. 3 shows an organic light emitting device having a first solution-deposited organic layer in physical contact with a second organic layer.

FIG. 3 shows an embodiment of the invention where a patterned emissive layer is solution deposited over and in physical contact with a hole transport layer. Device 300 is fabricated over a substrate 310. Substrate 310 is coated with an anode 320. The substrate and the anode layer may be selected from any suitable materials. A hole transport layer 330 and a layer 340 of an undoped emissive host material, are then deposited, in that order, over anode 320.

A patterned emissive layer that further comprises emissive regions 351 and 352 is then deposited by solution processing over and in physical contact with layer 340. A further emissive layer 360 is then deposited, by means other than solution processing, so as to form a blanket layer over and in contact with the patterned emissive layer which comprises emissive regions 351 and 352. Emissive layer 360 includes an active region 353 disposed under cathode 383 that, when the device is operated, will be the region of layer 360 that emits light. Any suitable material may be used for emissive layer 360. For example, emissive layer 360 may be deposited by means such as thermal vapor phase deposition. A full color display may be fabricated by depositing regions 351, 352 and 360 that include red, green, and blue emissive materials, respectively.

By solution depositing some emissive regions, such as regions 351 and 352, followed by the blanket deposition by another technique of another emissive layer, such as layer 360, many of the advantages of solution processing and the second technique are obtained. For example, ink-jet printing may be used to deposit regions 351 and 352, thereby achieving a good patterning resolution at with a relatively inexpensive technique. Layer 360 may then be blanket deposited by a non-solution based technique, such as thermal vapor deposition or organic vapor phase deposition. Any disadvantages associated with solution based techniques are thereby avoided for layer 360. But, the inexpensive patterning associated with some solution based processes may be retained. Layer 360 is effectively patterned even though it was blanket deposited, by selecting materials such that layer 360 emits only where regions 351 and 352 are not present.

Thus, layer 360 may be deposited without the use of a shadow mask or other patterning technique associated with non-solution based processes.

In many devices, it may be advantageous to vapor process at least one emissive material. In particular, it is believed that phosphorescent emissive materials, blue emitting materials, and especially blue emitting phosphorescent materials, may be particularly susceptible to any impurities introduced as a result of solution processing, because of the wide band gap of blue emitting materials and/or the long lifetime of excitons in phosphorescent materials. In one embodiment, red and green emitting phosphorescent materials may be deposited into patterned regions via solution processing, followed by the blanket deposition of a blue phosphorescent material via a non-solution based process. In another embodiment, red and green emitting fluorescent materials may be deposited into patterned regions via solution processing, followed by the blanket deposition of a blue fluorescent material via a non-solution based process. In another embodiment, fluorescent emissive materials may be deposited via solution based processing, followed by the blanket deposition of a phosphorescent material via a non-solution based process. By using a technique other than solution processing to deposit emissive layer 360, the disadvantages of solution processing may be avoided for layer 360. Other embodiments not specifically described may also be implemented.

An electron transport layer 370 is then deposited over emissive layer 360, and cathodes 381, 382 and 383 deposited over electron transport layer 370. Any suitable material and deposition technique may be used for substrate 310, anode 320, hole transport layer 330, electron transport layer 370, and cathode 380. In one embodiment, all organic layers except regions 351 and 352 are deposited by a non-solution based process, such as vapor deposition. In another embodiment, multiple layers may be solution deposited.

In the embodiment of FIG. 3, it may be desirable to select a host material for layers 340 and 351, 352 and 360 that has a hole mobility that is significantly higher than the electron mobility. In such a material, most recombination and exciton formation would occur near the top of layers 340 and regions 351, 352 and 360, where the emissive dopant is most likely to be concentrated. In addition, it may be desirable to use emissive dopants that trap charge carriers and/or excitons, such that carriers and excitons may not escape into other layers, or parts of layer 340 and regions 351, 352 and 360 that do not contain adequate emissive dopant.

The method described in the embodiment of FIG. 3 is not limited to the specific layers discussed with respect to FIG. 3. For example, layers not specifically described may be included, layers described may be omitted, and the order of layers may be modified.

The solution processing methods described herein may be used multiple times in a single device, and they may be combined. For example, a hole injection layer and hole transport layer may be fabricated, followed by the solution deposition of a patterned emissive layer and subsequent thermal vapor phase deposition of a further emissive layer, as described with respect to FIG. 3.

As used herein, "solution processible" means capable of being dissolved, dispersed, or transported in and/or deposited from a liquid medium, either in solution or suspension form.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting.

Material Definitions:

As used herein, abbreviations refer to materials as follows:

| | |
|---|---|
| CBP: | 4,4'-N,N-dicarbazole-biphenyl |
| m-MTDATA | 4,4',4"-tris(3-methylphenylphenlyamino)triphenylamine |
| Alq$_3$: | 8-tris-hydroxyquinoline aluminum |
| Bphen: | 4,7-diphenyl-1,10-phenanthroline |
| n-BPhen: | n-doped BPhen (doped with lithium) |
| F$_4$-TCNQ: | tetrafluoro-tetracyano-quinodimethane |
| p-MTDATA: | p-doped m-MTDATA (doped with F$_4$-TCNQ) |
| Ir(ppy)$_3$: | tris(2-phenylpyridine)-iridium |
| Ir(ppz)$_3$: | tris(1-phenylpyrazoloto,N,C(2')iridium(III) |
| BCP: | 2,9-dimethyl-4,7-diphenyl-1,10-phenanthroline |
| TAZ: | 3-phenyl-4-(1'-naphthyl)-5-phenyl-1,2,4-triazole |
| CuPc: | copper phthalocyanine. |
| ITO: | indium tin oxide |
| NPD: | naphthyl-phenyl-diamine |
| TPD: | N,N=-bis(3-methylphenyl)-N,N=-bis-(phenyl)-benzidine |
| BAlq: | aluminum(III)bis(2-methyl-8-quinolinato)4-phenylphenolate |
| mCP: | 1,3-N,N-dicarbazole-benzene |
| DCM: | 4-(dicyanoethylene)-6-(4-dimethylaminostyryl-2-methyl)-4H-pyran |
| DMQA: | N,N'-dimethylquinacridone |
| PEDOT:PSS: | an aqueous dispersion of poly(3,4-ethylenedioxythiophene) with polystyrenesulfonate (PSS) |

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. An organic light emitting device, comprising:
   a bottom electrode;
   a patterned first organic layer disposed over the bottom electrode, comprising a first region capable of emitting a first spectrum of light;
   a second organic layer disposed over and in physical contact with the first organic layer, the second organic layer being disposed over the bottom electrode, the second organic layer including a phosphorescent organic material capable of emitting a second spectrum of light, wherein the second spectrum of light is blue; and
   a top electrode disposed over the second organic layer.

2. The device of claim 1, wherein the patterned first organic layer further comprises a second regions, wherein the second region is capable of emitting a third spectrum of light.

3. The device of claim 2, wherein each of said first, second and third spectra of light are different.

4. The device of claim 2, wherein the first spectrum of light is red.

5. The device of claim 2, wherein the third spectrum of light is green.

6. The device of claim 1, wherein the first organic layer is deposited by solution processing.

7. The device of claim 6, wherein the solution processing is by ink jet.

8. The device of claim 1, wherein the second organic layer is deposited by thermal vapor phase deposition.

9. The device of claim 1, wherein the top electrode includes indium tin oxide.

10. The device of claim 1, wherein the top and bottom electrodes are electrically connected to the organic layers.

11. The device of claim 1, wherein the first organic layer is a hole transport layer and the second organic layer is an emissive layer.

12. The device of claim 1, wherein the second organic layer is an emissive layer comprising a neat layer of emissive material.

13. The device of claim 1, further comprising a third organic layer disposed between the bottom electrode and the first organic layer.

14. The device of claim 13, wherein the third organic layer is a hole transport layer, and the first organic layer is an emissive layer.

15. The device of claim 13, wherein the third organic layer is a hole injection layer, and the first organic layer is an emissive layer.

16. The device of claim 13, wherein the third organic layer is an electron blocking layer, and the first organic layer is an emissive layer.

17. The device of claim 13, further comprising a fourth organic layer disposed between the bottom electrode and the third organic layer.

18. The device of claim 17, wherein the fourth organic layer is a hole transport layer, and the third organic layer is an electron blocking layer.

19. A method of fabricating an organic light emitting device, comprising:

depositing a bottom electrode over a substrate;

depositing by solution deposition a patterned first organic layer over the bottom electrode, wherein the first organic layer comprises a first region capable of emitting a first spectrum of light;

depositing by a non-solution based technique a second organic layer over and in physical contact with the first organic layer, the second organic layer being disposed over the bottom electrode, the second organic layer including a phosphorescent organic material capable of emitting a second spectrum of light, wherein the second spectrum of light is blue; and depositing a top electrode over the second organic layer.

20. A method of fabricating an organic light emitting device, comprising:

depositing a bottom electrode over a substrate;

depositing by solution deposition a patterned first organic layer over the bottom electrode, wherein the first organic layer comprises two regions, a first region capable of emitting a first spectrum of light, and a second region capable of emitting a third spectrum of light;

depositing by a non-solution based technique a second organic layer over the first organic layer and the bottom electrode, and in physical contact with the first organic layer, wherein the second organic layer includes a phosphorescent organic material capable of emitting a second spectrum of light, wherein the second spectrum of light is blue; and depositing a top electrode over the second organic layer.

21. The method of claim 20, wherein the first spectrum of light is red, the second spectrum of light is blue, and the third spectrum of light is green.

* * * * *